United States Patent [19]
Thompson

[11] Patent Number: 6,058,125
[45] Date of Patent: May 2, 2000

[54] SEMICONDUCTOR LASERS

[75] Inventor: George Horace Brooke Thompson, Sawbridgeworth, United Kingdom

[73] Assignee: Nortel Networks Corporation, Montreal, Canada

[21] Appl. No.: 09/091,684

[22] PCT Filed: Jan. 24, 1997

[86] PCT No.: PCT/GB97/00225

§ 371 Date: Jun. 19, 1998

§ 102(e) Date: Jun. 19, 1998

[87] PCT Pub. No.: WO97/27651

PCT Pub. Date: Jul. 31, 1997

[30] Foreign Application Priority Data

Jan. 27, 1996 [GB] United Kingdom .................. 9601703

[51] Int. Cl.[7] ................................ H01S 3/19; G02B 6/12
[52] U.S. Cl. ................................ 372/50; 372/45; 385/14; 385/131
[58] Field of Search .................................. 372/50, 43–44, 372/46, 45; 385/14, 131–132

[56] References Cited

U.S. PATENT DOCUMENTS 5,278,926  1/1994  Doussiere .................................. 385/28

FOREIGN PATENT DOCUMENTS

| 0 624 041 A1 | 8/1994 | European Pat. Off. . |
| 0 514 2435 | 6/1993 | Japan . |
| 2 274 520 | 7/1994 | United Kingdom . |

OTHER PUBLICATIONS

Journal of Lightwave Technology vol. 11 (1993)Apr., No. 4. "Spot size expansion for laser–to–fiber coupling using an integrated multimode coupler." Jens Buus et al, pp. 582–588.

Proc.21st Eur.Conf on Op.Comm (ECOC'95—Brussels) (No month available) "Uncladded thickness tapers integrated with InGaAsP/InP rib waveguides for efficient fibre–chip butt coupling." L Mörl, et al, pp. 461–464.

Electronics Letters.,Mar. 26, 1992, vol.28,No. 7.,"Low–loss fibre–chip coupling by buried laterally tapered InP/InGaAsP waveguide structure." pp. 631–632 B Zengerle, et al.

Journal of Lightwave Technology vol. 12, No. 10, Oct. 1994. "Design and fabrication of monolithic optical spot size transformers (MOST's) for highly efficient fibre chip coupling." pp. 1782–1791 Gundolf Wenger et al.

Electronics Letters, Jul. 20, 1995, vol. 31, No. 15. "1.3 $\mu$m beam–expander integrated laser grown by single–step MOVPE" pp. 1241–1242. H Sato et al.

Electronics Letters, Jul. 20 1995, vol. 31, No. 15."Laser diodes monolithically integrated with spot–size converters fabricated on 2 inch InP substrates." pp. 1252–1254 M Wada et al.

IEEE Photonics Technology letters, vol. 6, No. 12, Dec. 1994. "InP–based multiple quantum well lasers with an integrated tapered beam expander waveguide." pp. 1412–1414 R Ben–Michael et al.

Electronics Letters, Jun. 22 1995, vol. 31, No. 13, "Spot–size converted 1.3 $\mu$m laser but jointed selectively grown vertically tapered waveguide." pp. 1069–1070 Tohmori et al.

IEEE Photonics Technology Letters, vol. 2 (1990) Feb., No. 2. "Tapered Waveguide in GaAs/InGaAsP Multiple–Quantum–Well Lasers." pp. 88–90 T. L. Koch.

*Primary Examiner*—Teresa M. Arroyo
*Assistant Examiner*—Quyen P. Leung
*Attorney, Agent, or Firm*—Lee, Mann, Smith, McWilliams, Sweeney & Ohlson

[57] ABSTRACT

A 'big spot' semiconductor laser has a passive modal spot size transformer (2) formed integrally in tandem with the active region (1) of the laser. The passive transformer has a layer structure (5, 6) that supports a restricted set of modes and is designed such that, at the laser frequency, its length provides a phase slippage of $\pi$ between modes of adjacent order.

6 Claims, 4 Drawing Sheets

SEMICONDUCTOR LASERS

BACKGROUND TO THE INVENTION

This invention relates to semiconductor lasers, and in particular to semiconductor lasers incorporating means to provide such a laser with an enlarged modal spot size at its output facet.

Primarily for reasons of efficiency, the layer structure of a typical semiconductor laser provides relatively strong waveguiding in the direction normal to the plane of the layers, this direction hereinafter being referred to as the 'vertical' direction. In its turn, this strong waveguiding gives rise to a modal spot size with a vertical dimension, typically about 2 $\mu$m, that is small in comparison with the modal spot size, typically about 10 $\mu$m, of conventional single mode optical fibre.

Some form of modal spot size transformer is therefore required to obtain efficient coupling of light from such a laser into single mode optical fibre.

The problem of launching light efficiently from a semiconductor laser into a single mode optical fibre has some parallels with the related problem of attaining high efficiency optical coupling between a single mode optical fibre and an optical waveguide formed in an integrated optics semiconductor chip.

One form that a spot size transformer can take is that of a microlens. This may be constituted by a lens formed on the end of the fibre, or by a discrete lens element separate from the fibre. The place of the discrete lens can be taken by some other form of discrete modal spot size transformer, or a modal spot size transformer formed integrally with the laser or integrated optics semiconductor chip. Examples of such modal spot size transformers that employ adiabatic tapers appear in the literature. Thus for instances articles by L M örl et al, R Zengerle et al, and G Wenger et al, respectively entitled 'Uncladded Thickness Tapers Integrated with InGaAsP/InP Rib Waveguides for Efficient Fibre-Chip Coupling' (Proc. 21st Eur. Conf. on Opt. Comm., ECOC 95, Brussels pp 461–4), 'Low-loss Fibre-Chip Coupling by Buried Laterally Tapered InP/InGaAsP Waveguide Structure' (Electronics Lett. Vol. 28, No. 7, pp 631–2), and 'Design and Fabrication of Monolithic Optical Spot Size Transformers (MOST's) for Highly Efficient Fiber-Chip Coupling' (J. Lightwave Technology Vol. 12, No. 10 pp 1762–90), each describe a respective example of modal spot size transformer for coupling a single mode optical fibre to a waveguide formed in an integrated optics semiconductor chip. Such transformers have to be precisely aligned with their respective chip waveguides, and the articles relate to transformers in which such alignment is achieved by creating each transformer and its associated chip waveguide in an integrated format.

An article by J Buus et al entitled 'Spot Size Expansion for Laser-to-Fibre Coupling Using an Integrated Multimode Coupler (J. Lightwave Technology Vol. 11, No. 4, pp 582–9) describes an alternative form of modal spot size transformer which is neither lens-based nor taper-based. Instead it employs a multilayered coupled waveguide structure using mode dispersion effects in a length of waveguide capable of supporting a limited number of modes. It is stated that the structure is designed for use with waveguides in semiconductor materials including semiconductor lasers, and that the structure is suitable for integration with a semiconductor laser or waveguide, but the authors do not actually describe how such integration can be accomplished. Operation of the structure requires its plane of symmetry of its waveguide layers to be aligned with the centre of the waveguide in the semiconductor chip. This implies a requirement for there to be at least some overlap in height between the chip waveguide layer structure and the transformer layer structure. The provision of such an overlap in an integrated format is complicated by the fact that, when epitaxial regrowth of a planar layer structure is attempted, the planar growth is very liable to be disrupted in the vicinity of any side-wall bounding that growth. Accordingly the integration of the Buus et al transformer with an integrated optics semiconductor ship or semiconductor laser appears a not entirely trivial task.

In the case of coupling a semiconductor laser to a single mode optical fibre using a taper-based modal spot size transformer, the transformer may be incorporated within the optical cavity of that laser, for instance as described by Y Tohmori et al, H Sato et al, M Wada et al, or R Ben-Michael et al, in articles respectively entitled, 'Spot-Size Converted 1.3 $\mu$m Laser with Butt Jointed Selectively Grown Vertically Tapered Waveguide' (Electronics Lett., Vol 31,m pp 1069–70), '1.3 $\mu$m Beam-Expander Integrated Laser Grown by Single-Step MOVPE' (Electronics Lett., Vol. 31, No. 15, pp 1241–2), 'Laser Diodes Monolithically Integrated with Spot-Size Converters Fabricated in 2 inch InP Substrates' (Electronics Lett., Vol 31, No. 15, pp 1252–4), and 'InP-Based Multiple Quantum Well Lasers with an Integrated Tapered Beam Expander Waveguide' (IEEE Photonics Tech. lett., Vol. 6, No. 12, pp 1412–4). Each of these examples uses a taper for vertical expansion of the laser modal spot size, and for such a taper to be substantially adiabatic (i.e. not to introduce additional loss due to the shortness of the taper) its length needs to be made at least comparable with the length, about 300 $\mu$m, of a typical semiconductor laser devoid of any form of modal spot size transformer.

SUMMARY OF THE INVENTION

There can be a number of reasons for not wishing to extend unduly the length of the optical cavity of a semiconductor laser. Thus the inclusion of a passive modal spot size converter of undue length in comparison with that of the active region of the laser can introduce excessive absorption. It also lowers the upper limit at which the laser can be directly modulated. The material cost is increased, and there may be increased problems associated with satisfactory bonding the structure to a heatsink. The present invention is directed to a modal spot size transformer suitable for incorporation into the optical cavity of a laser which can achieve vertical expansion of the laser modal spot more satisfactorily in a shorter distance than is readily achievable with a taperbased structure.

According to the present invention there is provided a semiconductor laser having an optical laser cavity in which is formed an active multiquantum well waveguiding layer structure in stacked relationship with an additional multilayer waveguide structure, wherein the additional multilayer waveguide structure extends to an end of the laser optical cavity, while the multiquantum well waveguiding structure terminates abruptly a predetermined distance short of said end, wherein, over said predetermined distance, the additional multilayer waveguide structure is a multilayer coupled waveguide structure that supports odd and even order modes comprising at least zero, first and second order modes, wherein the relative thicknesses and spacings of the layers of the additional multilayer waveguide structure are such that, over said predetermined distance and at a frequency at which the laser lases, and for each of the even order modes, there is a phase slippage between that even order mode and the or each other even order mode that is substantially equal to 2π, or an integral multiple thereof, and, for the or each odd order mode, there is a phase slippage between that odd order mode and any one of the even order modes that is substantially equal to π, or an odd integral multiple thereof.

Preferably the relative thicknesses and spacings of the layers of the additional multilayer waveguide structure are arranged such that, at the lasing wavelength, the phase slippage between modes of adjacent order is substantially equal to π over the predetermined distance that the multi-quantum well structure terminates short of the end of the additional waveguide multilayer structure.

BRIEF DESCRIPTION OF THE DRAWINGS

There follows a description of a semiconductor laser embodying the present invention in a preferred form. The description refers to the accompanying drawings in which.

DETAILED DESCRIPTION OF A PREFERRED EMBODIMENT

Figure 1:
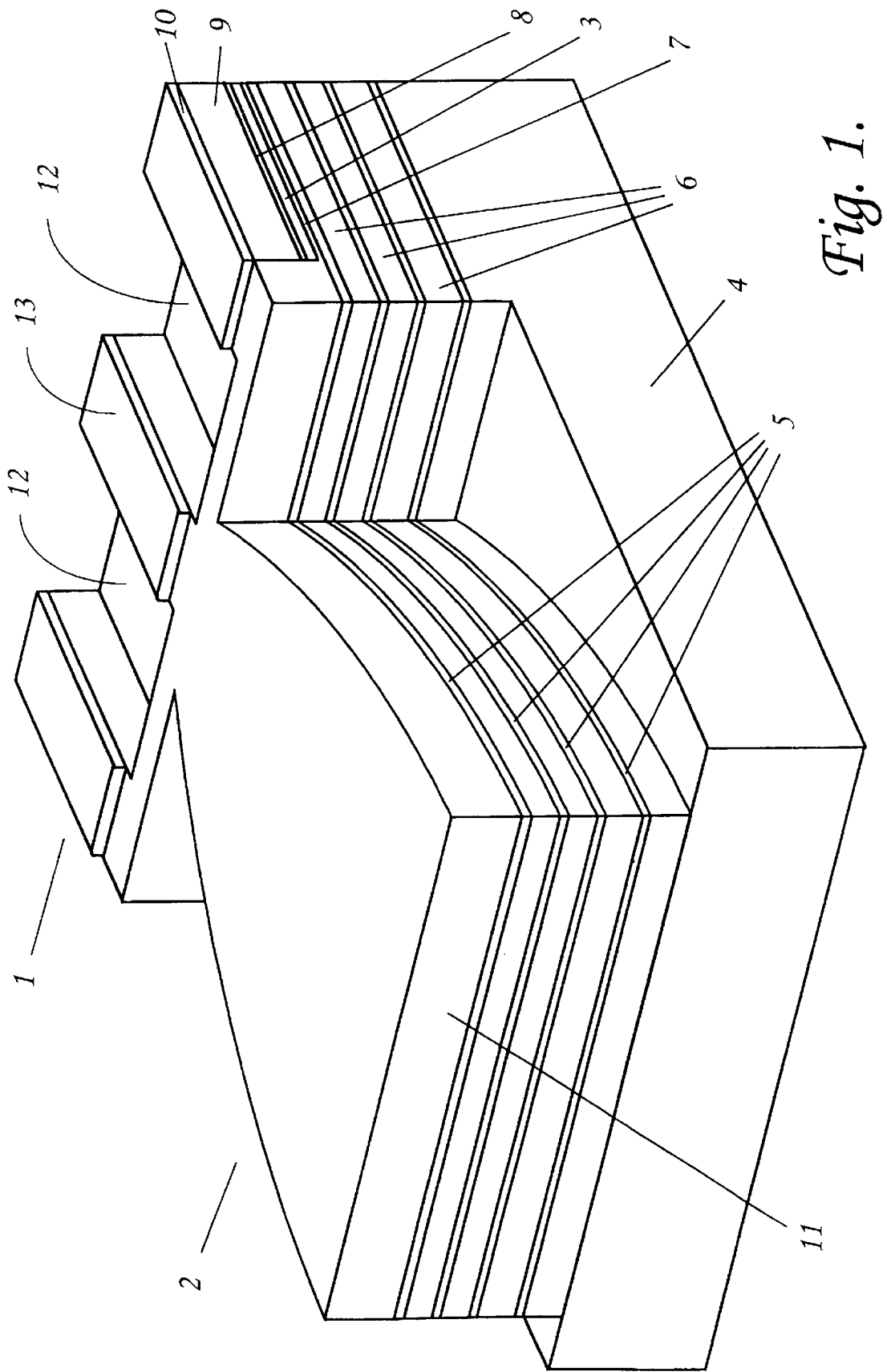
FIG. 1 is a schematic perspective view of the laser.

The semiconductor laser of FIG. 1 is a Fabry Perot laser emitting at λ=1.3 μm, and having, in tandem in its optical cavity, an active part 1, which provides optical gain when electrically pumped, and a passive part 2, which acts as a modal spot size transformer. In this example the active part is about 300 μm long, while the passive part is about 115 μum long.

The active part 1 is in essence a ridge structure multi-quantum well (MQW) laser structure with an underlying set of additional waveguide layers. It has a conventional MQW layer structure 3 composed of twelve 3.5 nm thick quantum wells of InGaAs interleaved with eleven 10 nm thick barrier layers of InGaAsP. Situated between the MQW layers 3 and a p-type InP substrate 4 is a set of four InGaAsP (λ=1.15 μm) waveguide layers 5 of unequal thickness interleaved with three InP layers 6, also of unequal thickness. The layers 5 are progressively thinner the further they are away from the MQW structure layers 3, being respectively 0.145 μm, 0.130 μm, 0.120 μm and 0.100 μm thick. The layers 6 are progressively thicker the further they are away from the MQW structure layers 3, being respectively 1.20 μm, 1.31 μm and 1.37 μm thick. The uppermost layers 5 is spaced from the lowest MOW layer by an etch stop layer 7 of InP. On the other side of the MOW layers the refractive index is graded by the presence of graded structure 8 comprising a pair of 20 to 30 nm thick quaternary material layers between the uppermost MQW layer and a covering layer 9 of InP. Deposited upon this covering layer 9 is a metallisation contact layer 10.

Initially the MQW layers extend over the whole area, including not only the active part 1, but also the passive part 2. The passive part 2 is etched down to the etch stop layer 7, and a layer 11 of InP is grown upon the portion of the etch stop layer thereby exposed.

Channels 12 are etched in the active part 1 through the metallisation and down into the InP layer 9 so as to define a rib 13 about 2 μm wide for providing lateral waveguiding for the light generated in this part. In the passive part 2 there is also etching, this proceeding right through the whole of the additional waveguide layers structure, constituted by layers 5 and 6, and into the material of the InP substrate 4.

The etching of the passive part 2 is so as to define an adiabatically tapered ridge which expands substantially parabolically from a width of about 3 μm, where it is adjacent the active part 1, to a width of about 12 μm at its free end. This taper is designed to expand the width of the modal spot.

Vertical expansion (expansion of the height) of the modal spot is effected by the arrangement of the layers of the additional waveguide layers structure. These layers are designed so that, in the passive region, where they are covered with the InP of layer 9 instead of the MQW layer structure 3 of the active region, they support zero, first, second and third order modes each of whose field distribution extends substantially across all four waveguides. Additionally the layers are arranged so that the propagation constants of these four modes form a regular series with the property that, at the laser emission wavelength, and over the propagation distance of the passive part 2, there is a phase slippage of π between adjacent order modes.

In the active region the additional high index material of the MQW layer structure 3 has the effect of loading the topmost layer 5 to the extent such as to make this combination of the MQW layer structure and topmost layer 5 a structure supporting a zero order mode that is not coupled to any substantial extent to the other three layers 5 in the active region, and higher order modes that are substantially confined to the lower layers.

Figure 2:
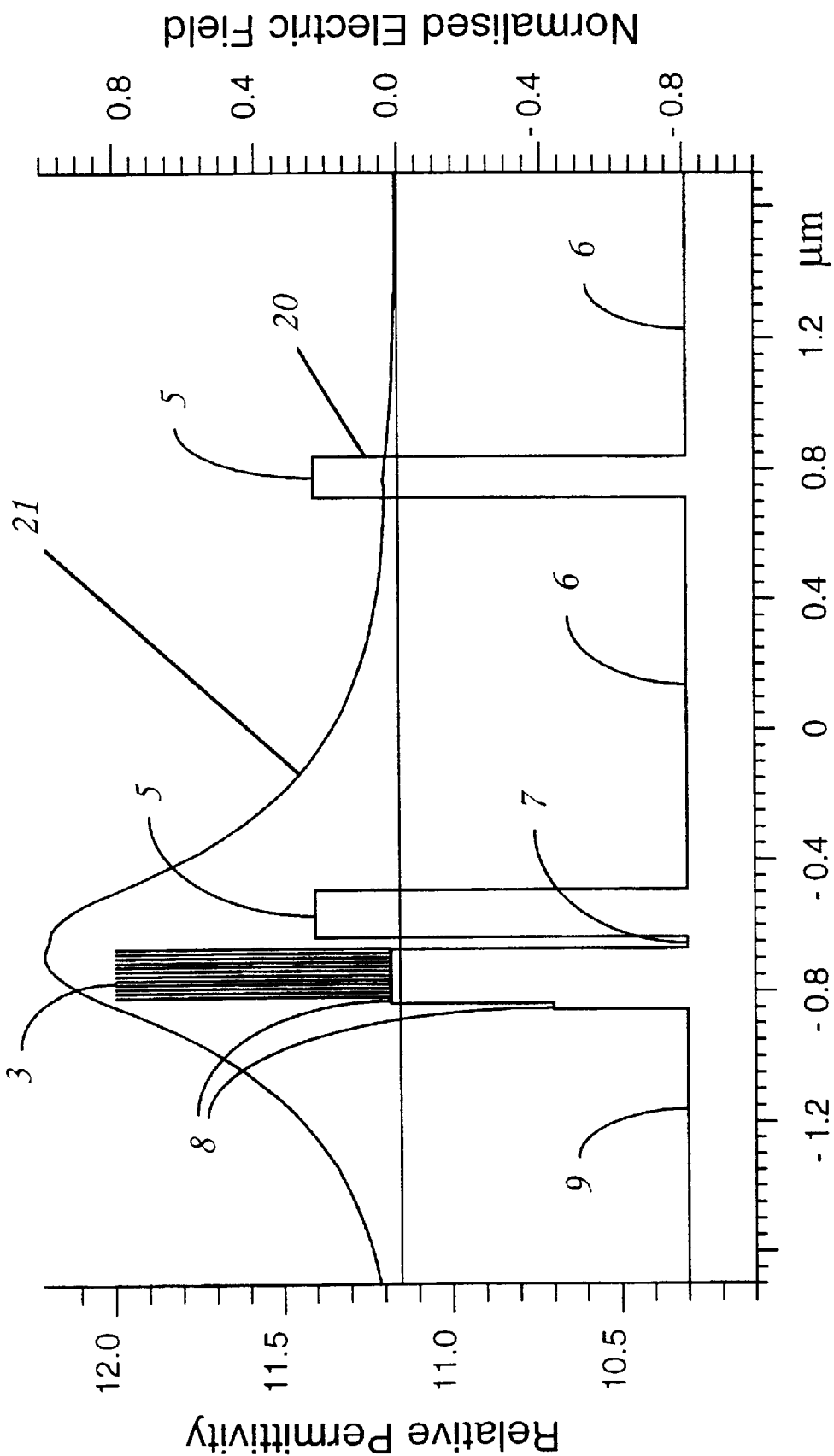
FIGS. 2, 3, and 4 are plots plotting relative permittivity and normalised electric field strength as a function of distance from the substrate at different positions in the laser.
Figure 3:
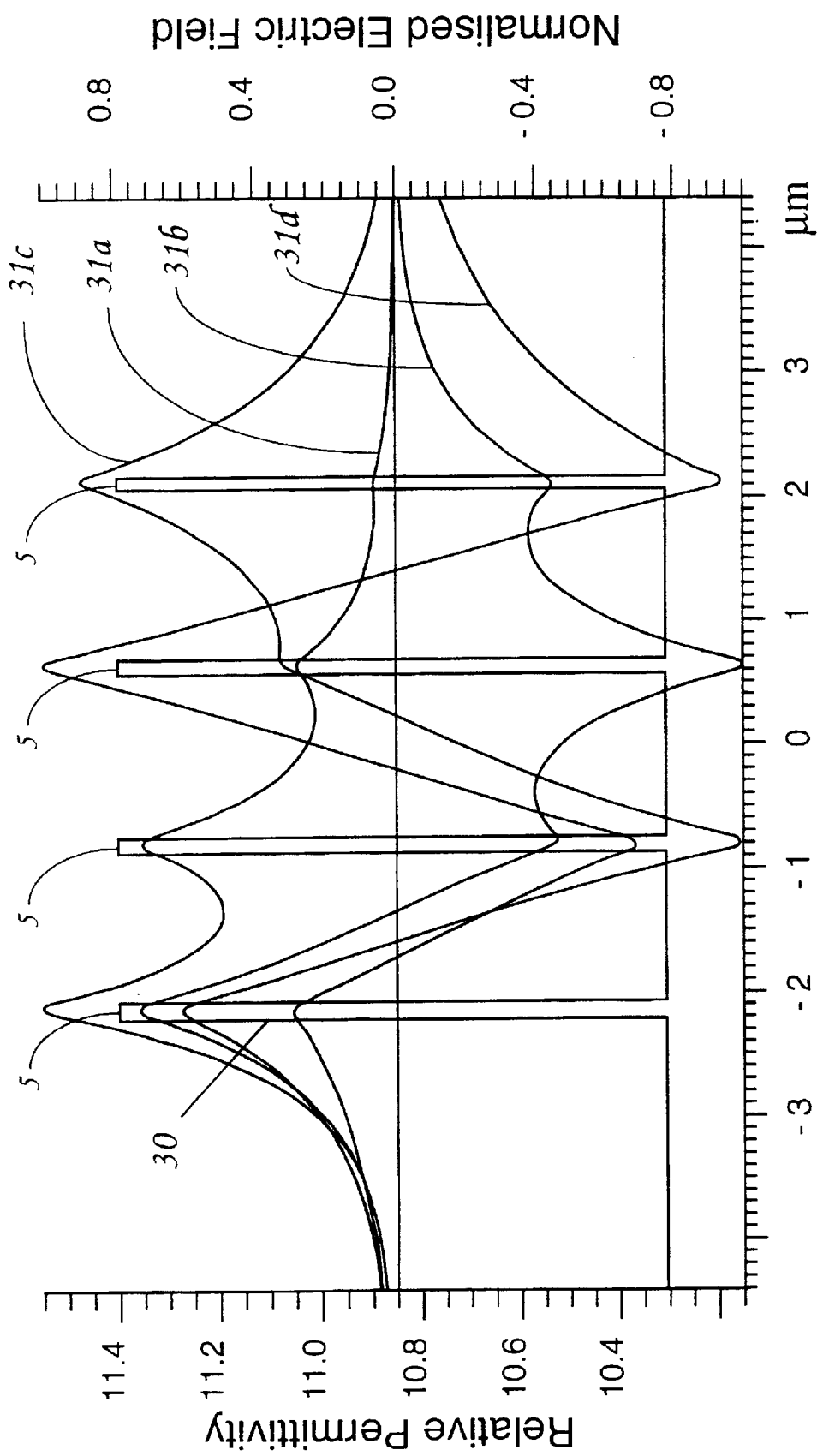

In FIG. 2 there is shown, for a portion of the active region 1, a plot 20 of the relative permittivity (square of refractive index) of the structure plotted as a function of height from an arbitrary plane lying between the topmost two of the four layers 5. This is plotted together with a plot 21 of the zero order TE polarisation mode normalised electric field (near-field pattern plot). In FIG. 3 are shown equivalent plots in respect of the passive region, plot 30 being a plot of the relative permittivity plotted as a function of height from an arbitrary plane lying between the second and third of the four layers 5, and also plots 31a, 31b, 31c and 31d being TE polarisation mode normalised electric field plots respectively of the zeroth, first, second and third order modes of the coupled waveguide structure formed by the four layers 5 in this passive region 2.

Figure 4:
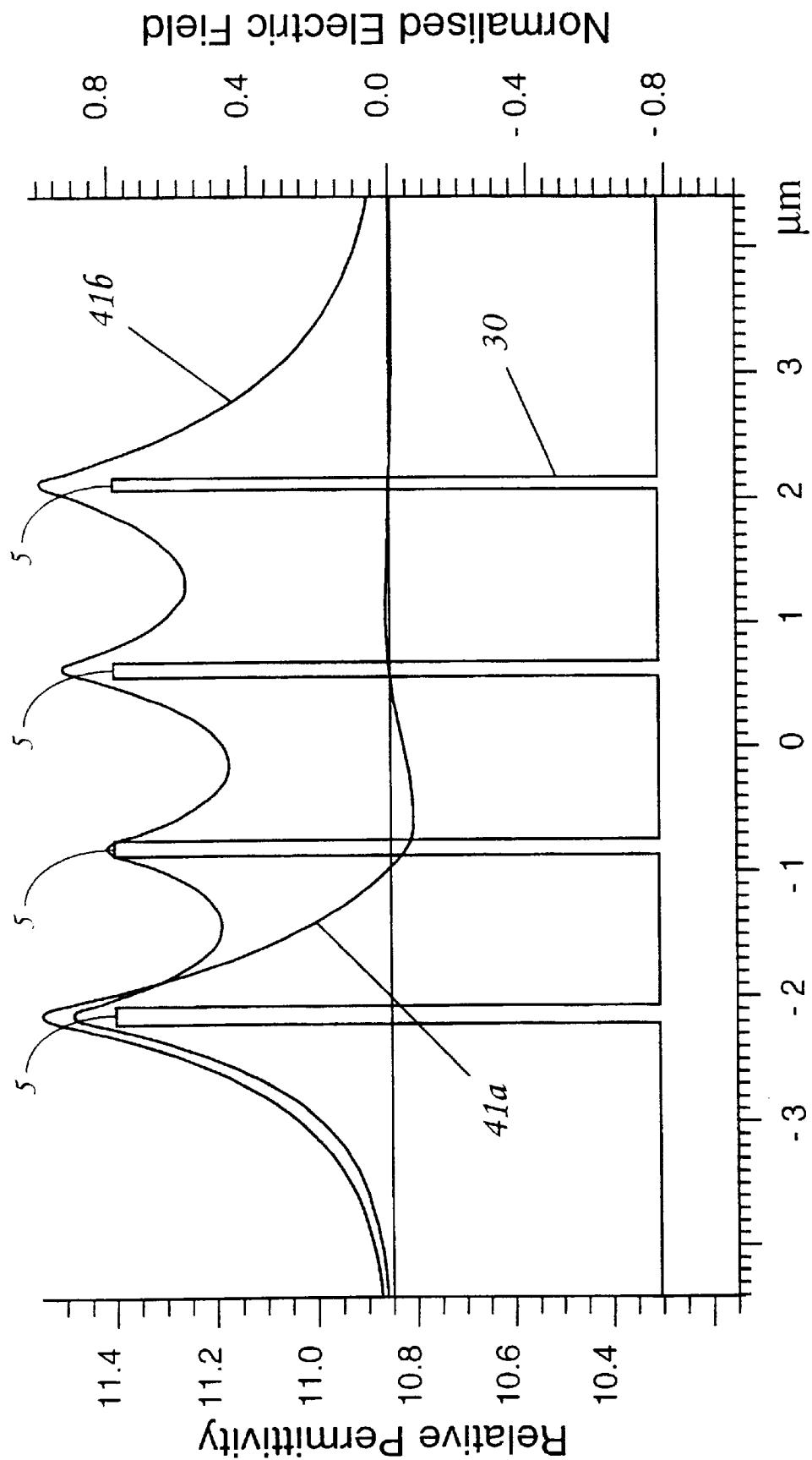

FIG. 4 is a repeat of FIG. 3, but with the four single mode plots 31a to 31d replaced by two mixed mode plots 41a and 41b. The mode mixture of plot 41a is an in-phase mixture of the zeroth, first, second and third order mode plots in such relative (normalised) proportions as are excited by the near field pattern of FIG. 2, while the mixture of plot 41b has the same relative proportions as that of plot 41a but, though the second order component is still in phase with the zero order component, the first and third order components are in antiphase with the zeroth and second order components. Remembering that the length of the passive region 2 is such as to introduce a phase slippage of π between adjacent order modes, it will be seen that a near-field pattern corresponding to plot 41a that is launched into one end of the passive region 2 is converted in its propagation through the passive region to a near-field pattern corresponding to plot 41b. Thus the passage through the passive region is seen to produce an effective enlargement in the vertical dimension (height) of the modal spot.

In the design of the additional waveguide layers, their thicknesses and spacings, there are a number of parameters that can be varied to secure the required phase relationships between its modes. To provide a design that has equal magnitude steps of specified magnitude in propagation constant between modes of adjacent order, and that produces a specified distribution of optical field at the output in a structure having N layers 5, requires the adjustment of (2N−2) parameters. Assuming the guides to have equal refractive index steps, then the width of one guide can be specified, and still leave (N−1) guide widths and (N−1) guide spacings to provide in principle a sufficient number of variables. The length of the coupler depends on the size of the steps in propagation constant, and may be reduced for fixed total width by reducing the strength of the individual guides (smaller guide width or smaller refractive index step) and by increasing the number of guides. The range of adjustment is limited, however, by the requirement that the highest order coupled mode is not too close to cut-off. At this limit a structure with more guides, although they have to be stronger, gives a shorter coupler.

For improving the match of the output field distribution of the N guides to that of the fibre it is an advantage not only to have the envelope of the field distribution approaching in width that of the fibre and of similar shape, but also to have the field not fall away excessively between guides. The latter behaviour can be best achieved by working near the limit of close guide spacing or weak guiding, set by cut-off as just described. In these circumstances more guides give no greater flatness.

The transmission efficiency from the laser into all the modes of the coupler is determined almost entirely by the step in the relative guiding strength of the input guide at the point where the MQW layer is terminated. In other words the transmission efficiency into the coupler would be almost 100% if the input guide were continuous with the topmost guide of the coupler. The above consideration determines the appropriate guiding strength for the topmost guide. For instance at a wavelegth of 1.3 $\mu$m, and with twelve quantum wells, the strength of topmost guide, measured in terms of the step $\delta n_{eff}$ between its effective index and the cladding index, should be greater than about 0.020 to produce an overall transmission loss less than about 0.3 dB. For a typical step in index of 0.16 between the cladding and the core layer of the guide this corresponds to a core layer thickness of about 0.15 $\mu$m. With many fewer quantum wells there would be no problem with transmission efficiency, but instead an upper limit to $\delta n_{eff}$ would apply. Above that limit the MQW layer would be insufficient to quench the coupling to the lower guides in the laser region, particularly if the guides were closely spaced. Once $\delta n_{eff}$ is established, other design parameters follow. The average spacing between guides that gives the minimum droop in optical field and the minimum coupler length, and incidentally brings the highest order coupler mode close to cutoff, is proportional to $\delta n_{eff}^{-1/2}$. In the above instance it is about 1.2 $\mu$m. The coupler length in these circumstances depends on $^8$neff and the number of guides N approximately as $(N-1)/\delta n_{eff}$, and the width between the outermost guides varies approximately as $(N-1)\delta n_{eff}^{-1/2}$. Hence for fixed coupler length the total width can be increased by increasing both $\delta n_{eff}$ and $(N-1)$ in proportion. In the present instance of the preferred embodiment described above, the coupling length with four guides is about 120 $\mu$m, giving a total width of about 3.6 $\mu$m. This couples to the fibre with a loss of around 0.8 dB. If increased coupler length is not a limitation, then the total width may be increased somewhat in the obvious way by increasing the guide spacing or by increasing the number of guides, although the former will increase the droop of the field between guides.

To analyse and design the details of the guide thicknesses and spacings it is necessary to derive the transverse field distribution of the coupled modes, their propagation constants, and their overlap integrals with the field distributions of the input guide and the output fibre. The overlap integrals give the transmission coefficients into the various modes, and the overall transmission coefficient is obtained by summing the product of the input and suitably phased output transmission coefficients of all the individual coupled modes. The criterion for a good design with a given strength of input guide and a given total number of guides is that the propagation constants of the coupled modes should be equally separated at the appropriate spacing for the desired coupler length and for shortest coupling length, with the highest order coupled mode close to cutoff, and that the coupled modes should be generated in the same proportion whether excited from the laser or the fibre. The field distributions, the propagation constants and the overlap integrals of the coupled modes need to be obtained exactly by solving the wave equation for the combined structure. The approximate methods of simple coupled mode theory are not adequate for the tight coupling that is involved in these structures. The optimum design is best approached by an iterative method. The (2N−2) performance factors (differences between the relative amplitudes of coupled modes generated by the input guide and generated by the fibre, and differences between the propagation constants of adjacent coupled modes), say $Y_j$, are each affected by the (2N−2) dimensions (spacing of guides and widths of all guides except input), say $X_i$, and hence are related by a (2N−2)×(2N−2) matrix. A gradient matrix $\partial Y_j/\partial X_i$ may be obtained by finding the changes $\delta Y_j$ in all the $Y_j$ produced by perturbations $\delta X_j$ in all the dimensions. This may then be inverted to the form $\partial X_i/\partial Y_j$ to enable the corrections to the dimensions to be found in terms of the errors $\delta Y_j$ in the performance factors.

What is claimed is:

1. A semiconductor laser having an optical laser cavity in which is formed an active multiquantum well waveguiding layer structure in stacked relationship with an additional multilayer waveguide structure, wherein the additional multilayer waveguide structure extends to an end of the laser optical cavity, while the multiquantum well waveguiding structure terminates abruptly a predetermined distance, short of said end, wherein, over said predetermined distance, the additional multilayer waveguide structure is a multilayer coupled waveguide structure that supports odd and even order modes comprising at least zero, first and second order modes, wherein the relative thicknesses and spacings of the layers of the additional multilayer waveguide structure are such that, over said predetermined distance and at a frequency at which the laser lases, and for each of the even order modes, there is a phase slippage between that even order mode and the or each other even order mode that is substantially equal to 2$\pi$, or an integral multiple thereof, and, for the or each odd order mode, there is a phase slippage between that odd order mode and any one of the even order modes that is substantially equal to $\pi$, or an odd integral multiple thereof.

2. A semiconductor laser as claimed in claim 1, wherein the phase slippage over said predetermined distance at a frequency at which the laser lases is equal to $\pi$ between modes of adjacent order.

3. A semiconductor laser as claimed in claim 2, wherein the additional multilayer waveguide structure consists of three layers of material each bounded on both faces by material of lower refractive index.

4. A semiconductor laser as claimed in claim 1, wherein the additional multilayer waveguide structure consists of four layers of material each bounded on both faces by material of lower refractive index.

5. A semiconductor laser as claimed in claim 4, wherein the phase slippage over said predetermined distance at a frequency at which the laser lases is equal to $\pi$ between modes of adjacent order.

6. A semiconductor laser as claimed in claim 1, wherein the additional multilayer waveguide structure consists of three layers of material each bounded on both faces by material of lower refractive index.

* * * * *